United States Patent [19]

Kornhaas

[11] Patent Number: 5,521,832
[45] Date of Patent: May 28, 1996

[54] METHOD FOR CHECKING AN OUTPUT STAGE AND AN ELECTRICAL LOAD TRIGGERED BY THE OUTPUT STAGE FOR THE PRESENCE OF A FAULT

[75] Inventor: Robert Kornhaas, Schwieberdingen, Germany

[73] Assignee: Robert Bosch GmbH, Stuttgart, Germany

[21] Appl. No.: 230,650

[22] Filed: Apr. 21, 1994

[30] Foreign Application Priority Data

Apr. 24, 1993 [DE] Germany .............. 43 13 532.3

[51] Int. Cl.⁶ .................................................. G01R 19/00
[52] U.S. Cl. .................................................... 364/483
[58] Field of Search .............. 364/483; 361/93, 361/62, 64, 66, 81, 115–118, 97, 89, 96, 87, 86, 71, 78, 79; 340/639; 324/424

[56] References Cited

U.S. PATENT DOCUMENTS

| | | | |
|---|---|---|---|
| 5,245,289 | 9/1993 | Rumfield et al. | 324/424 |
| 5,270,658 | 12/1993 | Epstein | 324/424 |
| 5,335,135 | 8/1994 | Kinney | 361/79 |
| 5,343,192 | 8/1994 | Yenisey | 340/639 |
| 5,353,188 | 10/1994 | Hatakeyama | 361/97 |
| 5,375,032 | 12/1994 | Hatakeyama et al. | 361/187 |
| 5,384,678 | 1/1995 | Ebersohl et al. | 361/62 |
| 5,424,894 | 6/1995 | Briscall et al. | 361/45 |

Primary Examiner—James P. Trammell
Attorney, Agent, or Firm—Felfe & Lynch

[57] ABSTRACT

An intelligent output stage having a downstream electrical load is checked by a brief change in the trigger voltage from time to time and the status signal on a monitoring line is monitored in two phases after this change.

12 Claims, 6 Drawing Sheets

METHOD FOR CHECKING AN OUTPUT STAGE AND AN ELECTRICAL LOAD TRIGGERED BY THE OUTPUT STAGE FOR THE PRESENCE OF A FAULT

BACKGROUND OF THE INVENTION

In the case of ABS (anti-lock brake system) or traction control system, for example, it is necessary to monitor the output stages and the downstream solenoid valves for faults which occur. Today, so-called intelligent output stages, also called power circuit breakers, are on the market which exhibit a feedback. Reference may be made here, for example, to the power circuit breakers TLE4224 and TLE5224 by Siemens and to U577 by SGS Thomson. It emerges from the provisional specification of TLE4224, that these power circuit breakers are used to signal faults such as, for example, undervoltage, loss of power, short circuits to earth in the operating and quiescent state of the circuit breaker, and short circuits to battery voltage in the case of an activated circuit breaker. In addition to inductive loads, ohmic loads (e.g. a heat source) can also be monitored.

SUMMARY OF THE INVENTION

By means of the dynamic method according to the invention a short circuit to battery (overload) can be identified even in the case of a non-activated load. In a further embodiment a short circuit between solenoid valves can also be identified.

DETAILED DESCRIPTION OF THE PREFERRED EMBODIMENT

Figure 1:
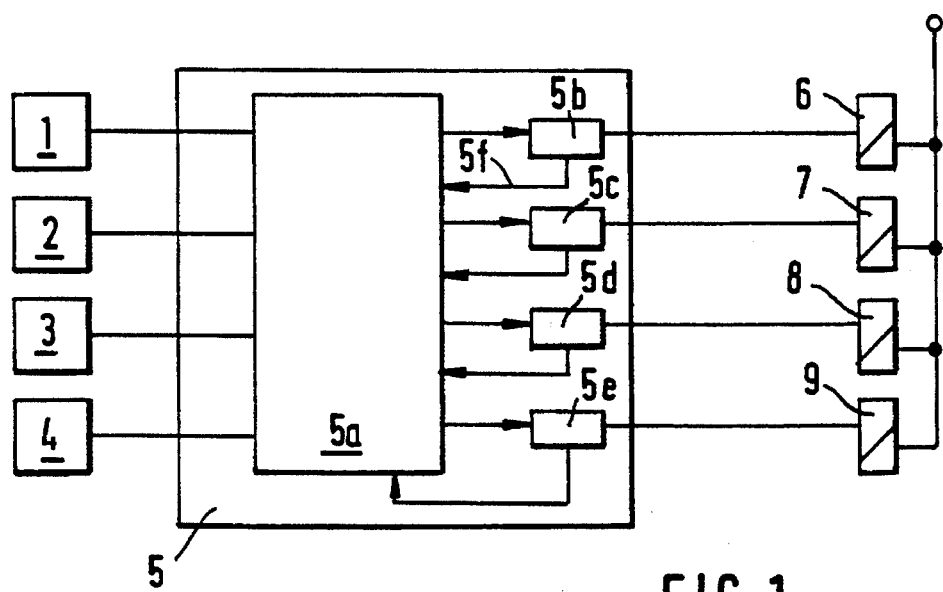
FIG. 1 is a block diagram of an ABS with feed back-type circuit breakers in the power output stages to the solenoid valves.

In FIG. 1, the wheel speed sensors 1 to 4 of an ABS supply signals to an evaluation circuit 5 containing a microprocessor 5a which generates trigger signals for the brake-pressure control valves 6 to 9 from the wheel speed signals. The valves are triggered via four output stages with the power circuit breakers 5b to 5e described above.

Figure 2:
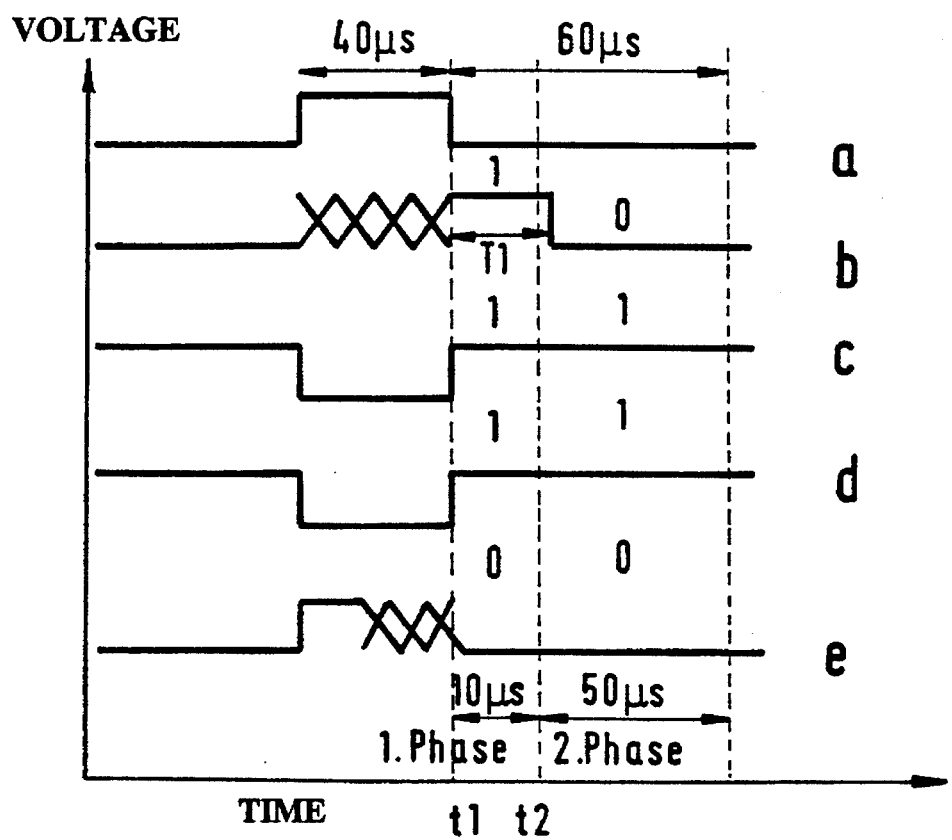
FIG. 2 is a timing diagram showing the triggering voltage (a) for a non-triggered valve, and monitoring voltages (b to e) indicating various conditions.

The microprocessor 5a also checks the power circuit breakers 5b to 5e by applying to them from time to time a checking pulse of, for example, 40 µs in the case of a non-triggered valve as shown in FIG. 2a, which does not cause the valve to respond due to its inertia. Upon termination of this pulse at instant $t_1$ and without a fault being present, the power circuit breaker, for example 5b, generates a pulse as shown in FIG. 2b on the monitoring line 5f which ends after a first interval $T_1$, for example 15 µs. During the interval $T_1$, for example between the instants $t_1$ and $t_2$ (e.g. 10 µs), the microprocessor samples the monitoring line and determines a high signal (1). In addition, the microprocessor samples the monitoring line 5f during a second phase (e.g. 50 µs) and determines that a low signal (0) is present here. From this pulse train (1, 0), the microprocessor detects that no power break, no short circuit to earth, and no short circuit to battery voltage is present. The crossed lines in FIGS. 2b and 2e mean that the state of the signal in these phases is undefined and therefore a high or a low signal can be present.

The sampling can be carried out in such a way that after a trigger voltage change from high to low the monitoring line is sampled several times during the next 60 µs (between 22 and 30 times as a function of the quartz frequency and thus of the operating frequency of the microcontroller). During the first phase (2 to 10 µs after the change in triggering voltage) a check is done for high and during the second phase (10 to 60 µs after the voltage change) a check is done for low.

The result of the sampling is interpreted as fault-free if during the first phase the feedback was at least once on high and during the second phase the feedback was at least once on low.

If no fault is present (no short circuit of the power output to battery voltage or earth, respectively, no power break at the power output), the sampling returns a high pulse ($T_1$ in FIG. 2b) lasting approximately 10 to 20 µs. This pulse is detected by the microprocessor 5 and interpreted as "output stage, solenoid valve fault-free".

If a break is present at the power output (FIG. 2c) or a short circuit to earth (FIG. 2d), the sampling returns a constant high after the triggering voltage change; i.e., this fault is detected by sampling the high throughout the second phase (pulse train 1, 1).

If a short circuit exists between the power output and the battery voltage (FIG. 2e) and the triggering voltage again changes from high to low, the signal on the monitoring line also changes immediately from high to low. The fault is detected by sampling the low during the first phase (pulse train 0, 0).

Figure 3:
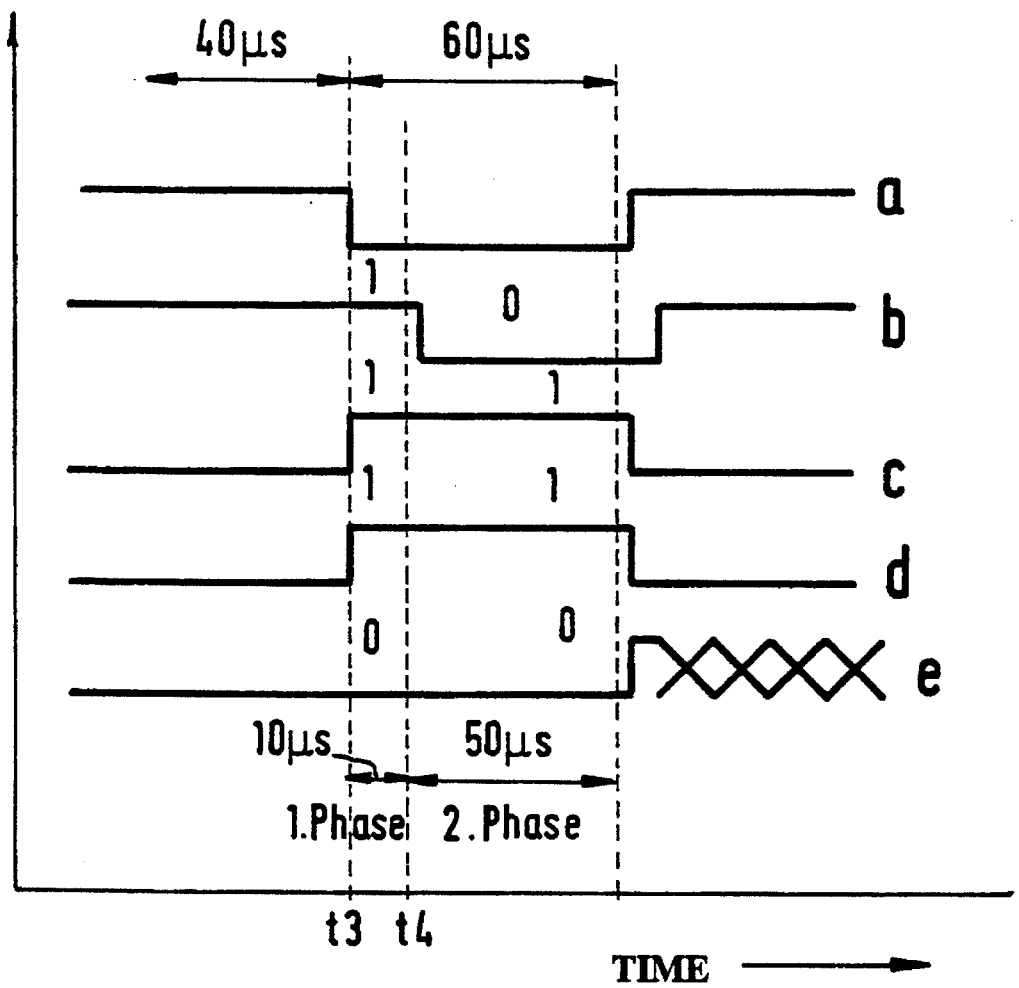
FIG. 3 is a timing diagram showing the triggering voltage (a) for a triggered valve and monitoring voltages (b to e) indicating various conditions.

FIG. 3 shows the case in which the valve is triggered and now for a time (approximately 70 µs) the trigger signal is brought to low (FIG. 3a), the valve not being released due to its inertia. Without faults, the sampling stream 1, 0 (FIG. 3b) results. In the case of a line break (FIG. 3c) and in the case of a short circuit to earth (FIG. 3d), the signal sequence 1, 1 shown there appears on the monitoring line. Finally, in the case of a short circuit to the battery voltage the signal sequence of FIG. 3e (0, 0) is obtained.

The four power circuit breakers 5b to 5e can now be checked in a staggered manner.

Figure 4:
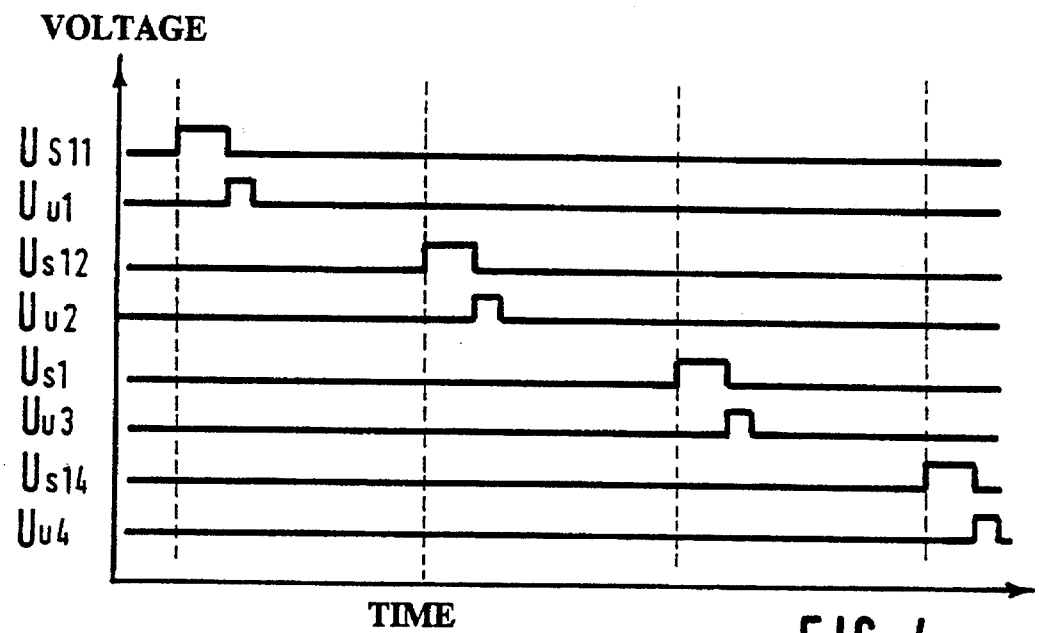
FIG. 4 is a timing diagram showing the triggering voltage and monitoring voltage for all four non-triggered output stages when no faults are present.

Outside of this control, one output stage is checked per software cycle (Tp=10 ms) and the feedback of this output stage is repeatedly sampled during the 60 μs following the change in triggering voltage. During the following software cycle, the next output stage is checked and the feedback of this output stage is monitored etc. Once all output stages have been checked, a start is made again at the first output stage. In the case of 4 output stages, for example, the total time taken for the complete check of all output stages is 40 ms. FIG. 4 shows this, Us denoting the trigger voltage, and Uu the voltage on the monitoring line. No fault is present in FIG. 4.

Figure 5:
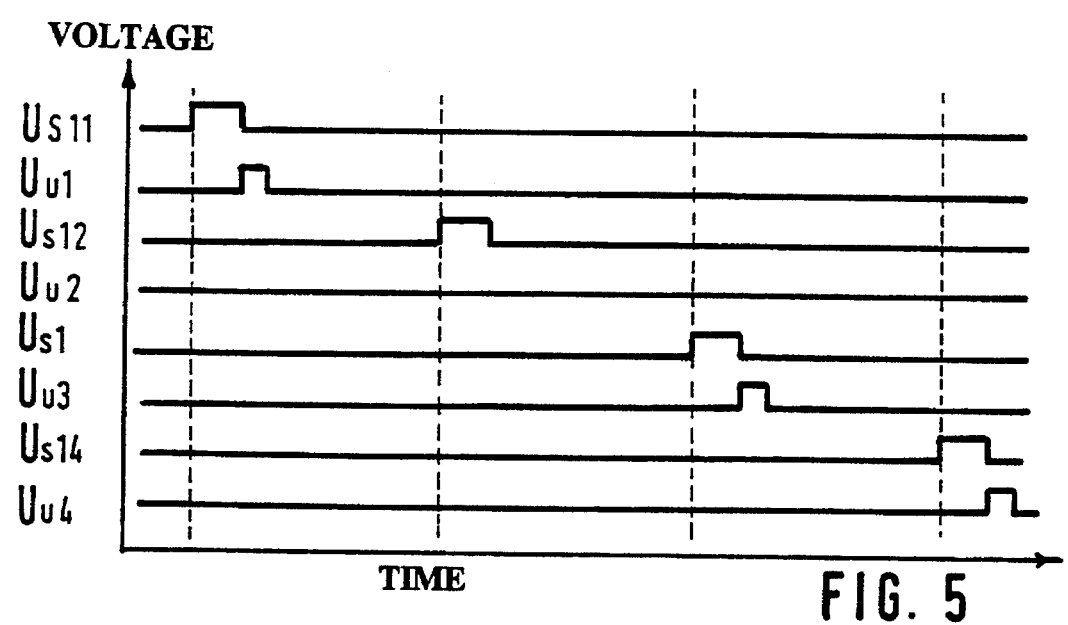
FIG. 5 is a timing diagram showing the detection of a short circuit in a non-triggered output stage.
Figure 6:
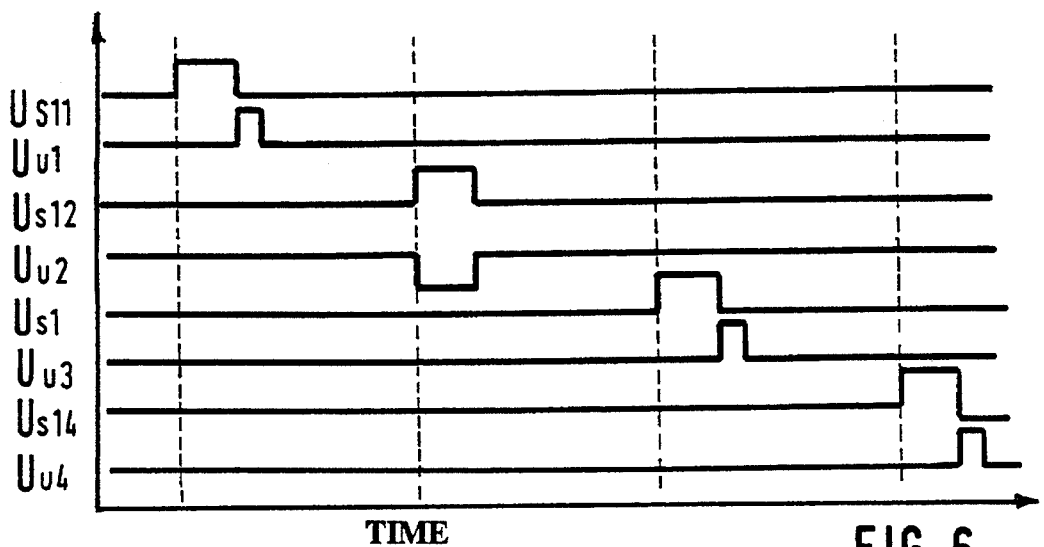
FIG. 6 is a timing diagram showing the detection of a break in a non-triggered output stage.

If a short circuit exists in the power output of a non-triggered output stage, or if a break is present, this fault is detected by the pulse train. In the case of a short circuit, the feedback line is always on low after the triggering voltage drop (FIG. 5, line Uu2). In the case of a break, a high is always detected on the monitoring line after the triggering voltage drop (FIG. 6, line Uu2). The fault in both case is assumed to be at the power circuit breaker 5c (=Us12).

Figure 7:
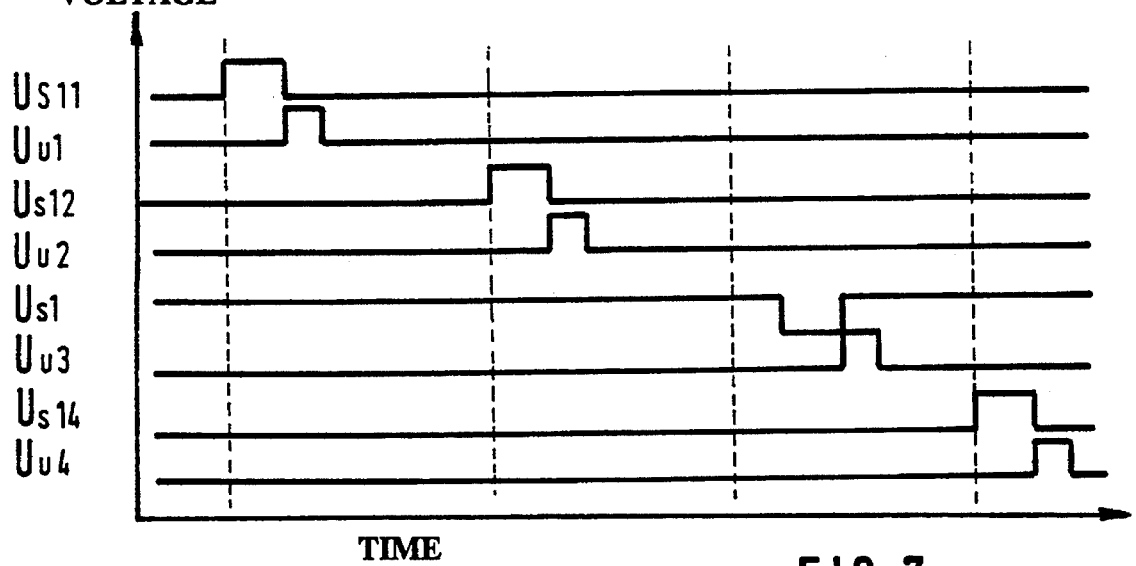
FIG. 7 is a timing diagram showing the detection of a short circuit to battery voltage in a triggered output stage.

FIG. 7 shows the case in which the valve 8 (US13) is triggered and the power stage exhibits a short circuit to the battery voltage.

Figure 8:
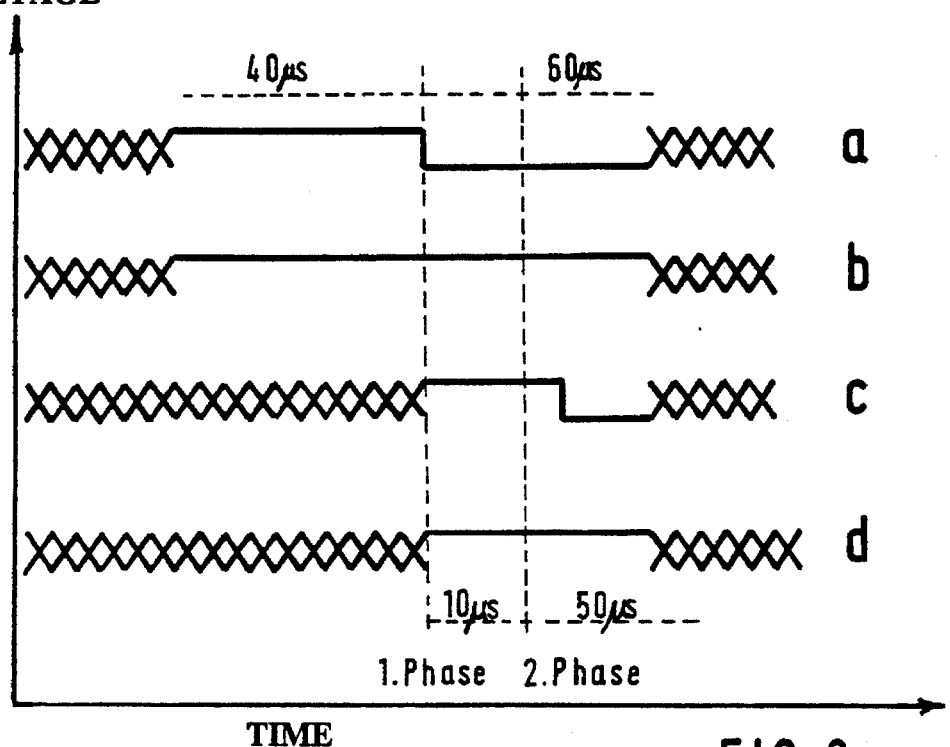
FIG. 8 is a timing diagram showing triggering voltages (lines a and b) for indicating absence (line c) and presence (line d) of a short circuit between two output stages.

According to a further development, it is additionally checked whether a short circuit exists between the connections of the two output power stages. According to FIG. 8, this can be done by applying a checking pulse to two power circuit breakers according to FIGS. 8a and 8b which results in the pulse train of FIG. 8c for the first power circuit breaker in the case of no short circuit. FIG. 8d shows the pulse train in case of a short circuit between the power outputs of both output stages.

In order to detect a short circuit between the power outputs of two (or more) output stages, the feedback of all output stages is sampled during the first and second phases; i.e., in contrast to the basic method where only the feedback of the output stage being checked is sampled, the feedback of all is sampled.

Figure 9:
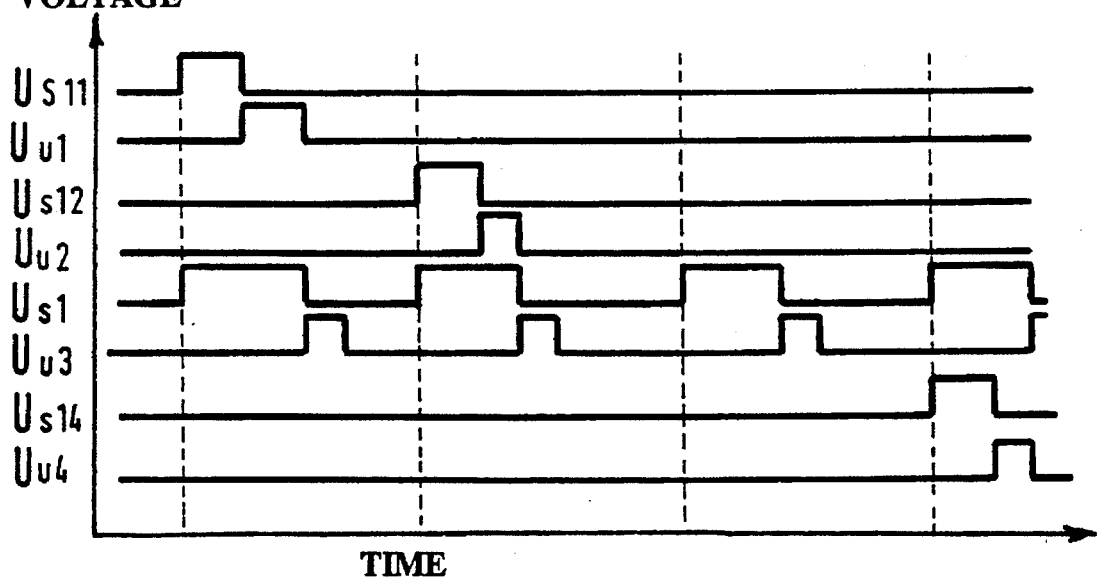
FIG. 9 is a timing diagram indicating a short circuit between one stage and any other stage where no short circuit is present.

According to FIG. 9, it is checked whether a short circuit exists between one of the power stages 5b, 5c, or 5e and the power stage 5d (line Us13). In FIG. 9 no short circuit exists.

Figure 10:
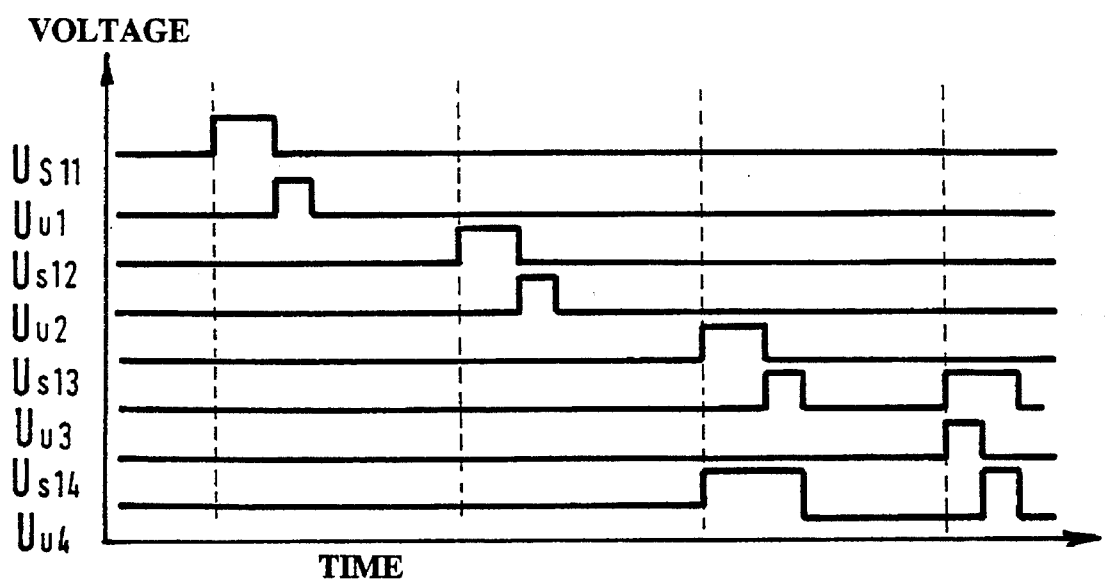
FIG. 10 is an alternative timing diagram for indicating a short circuit between one stage and any other stage where a short circuit is present.

In the example shown in FIG. 10, the short circuit between the output stages 5d and 5e in the case of the check of the output stage 5d during the first phase emits a high and thus indicates a short circuit between the power outputs of both valves; the same applies in the case of the check of the output stage 5e.

I claim:

1. Method of checking at least one output stage and an electrical load triggered by said output stage for presence of a fault, said fault being one of a short circuit to earth, power loss, and a short circuit to battery voltage, said method comprising providing a power circuit breaker in each said at least one output stage, from time to time applying a trigger voltage to each said power circuit breaker for a time period which is not sufficient to have any effect on said electrical load, said trigger voltage making a transition from high to low upon completion of said period, emitting a high signal for a first time interval of predetermined length $T_1$ on a monitoring line when said transition is detected, checking said monitoring line for presence of said high signal during said first time interval, checking said monitoring line for presence of said high signal during a second time interval following said first time interval, and inferring freedom from any said fault when said high signal is present at least once during said first time interval and said high signal is absent at least once during said second time interval.

2. Method according to claim 1 wherein the checking is carried out with a constant rhythm.

3. Method according to claim 2 wherein a plurality of output stages and electrical loads being used in a system are monitored by a checking device in a staggered manner.

4. Method according to claim 3 wherein during the first interval of monitoring an output stage the monitoring lines of at least a part of the other output stages including electrical load are additionally monitored and a short circuit between the power outputs of both output stages is inferred from the signal on one of the other monitoring lines in the first interval.

5. Method according to claim 3 wherein with the change of the trigger voltage of a first power circuit breaker from low to high a second power circuit breaker is triggered from low to high for the time of the change and a subsequent time longer than $T_1$, and wherein a short circuit between the outputs of the first and second power circuit breakers is inferred from the fact of the triggering of the other power circuit breaker and a high signal on the monitoring line of the first power circuit breaker during the second interval.

6. Method according to claim 3 wherein staggered checking of the individual power circuit breakers for short circuit to another power circuit breaker is carried out in between the staggered monitoring of the individual power circuit breakers.

7. Method of checking at least one output stage and an electrical load triggered by said output stage for presence of a fault, said fault being one of a short circuit to earth, power loss, and a short circuit to battery voltage, said method comprising providing a power circuit breaker in each said at least one output stage, from time to time applying a trigger voltage to each said power circuit breaker for a time period which is not sufficient to have any effect on said electrical load, said trigger voltage making a transition from high to low at the beginning of said period, emitting a high signal for a first time interval of predetermined length $T_1$ on a monitoring line when said transition is detected, checking said monitoring line for presence of said high signal during said first time interval, checking said monitoring line for presence of said high signal during a second time interval following said first time interval, and inferring freedom from any said fault when said high signal is present at least once during said first time interval and said high signal is absent at least once during said second time interval.

8. Method according to claim 7 wherein the checking is carried out with a constant rhythm.

9. Method according to claim 8 wherein a plurality of output stages and electrical loads being used in a system are monitored by a checking device in a staggered manner.

10. Method according to claim 9 wherein during the first interval of monitoring an output stage the monitoring lines of at least a part of the other output stages including electrical load are additionally monitored and a short circuit between the power outputs of both output stages in inferred from the signal on one of the other monitoring lines in the first interval.

11. Method according to claim 9 wherein with the change of the trigger voltage of a first power circuit breaker from low to high a second power circuit breaker is triggered from low to high for the time of the change and a subsequent time longer than $T_1$, and wherein a short circuit between the outputs of the first and second power circuit breakers is inferred from the fact of the triggering of the other power circuit breaker and a high signal on the monitoring line of the first power circuit breaker during the second interval.

12. Method according to claim 9 wherein staggered checking of the individual power circuit breakers for short circuit to another power circuit breaker is carried out in between the staggered monitoring of the individual power circuit breakers.

* * * * *